(12) United States Patent
Hu (10) Patent No.: US 7,436,055 B2
(45) Date of Patent: Oct. 14, 2008

(54) PACKAGING METHOD OF A PLURALITY OF CHIPS STACKED ON EACH OTHER AND PACKAGE STRUCTURE THEREOF

(75) Inventor: Chieh-Chia Hu, Kao-Hsiung (TW)

(73) Assignee: Advanced Semiconductor Engineering, Inc., Kao-Hsiung (TW)

( * ) Notice: Subject to any disclaimer, the term of this patent is extended or adjusted under 35 U.S.C. 154(b) by 50 days.

(21) Appl. No.: 11/459,919

(22) Filed: Jul. 25, 2006

(65) Prior Publication Data

US 2007/0138615 A1 Jun. 21, 2007

(30) Foreign Application Priority Data

Dec. 16, 2005 (TW) ................ 94144837 A (51) Int. Cl.
*H01L 23/552* (2006.01)
*H01L 23/02* (2006.01)

(52) U.S. Cl. ............... 257/686; 257/660; 257/E23.114; 257/E23.115; 257/E25.011; 257/E25.013

(58) Field of Classification Search .......... 257/723, 257/686, 660; 174/254, 260, 261
See application file for complete search history.

(56) References Cited

U.S. PATENT DOCUMENTS

| 6,534,391 | B1 * | 3/2003 | Huemoeller et al. ........ 438/612 |
| 7,033,911 | B2 * | 4/2006 | Manepalli et al. ........... 438/455 |
| 2001/0008306 | A1 * | 7/2001 | Kamei et al. ................ 257/723 |

\* cited by examiner

*Primary Examiner*—David A Zarneke
(74) *Attorney, Agent, or Firm*—Winston Hsu (57) ABSTRACT

A package structure with a plurality of chips stacked on each other includes a substrate, a first chip and second chip. The substrate has a dielectric layer, a metal layer having a conducting trace area and a shielding area formed on the dielectric layer, and a solder mask formed on the conducting trace area. The first chip and the second chip are electrically connected to the conducting trace area and arranged on the solder mask respectively. The first chip has a package body connected with one surface of the metal layer for arranging the first chip between the solder mask and the shielding area of the metal layer. The second chip has a package body connected with the other surface of the metal layer for arranging the second chip between the solder mask and the shielding area of the metal layer.

9 Claims, 7 Drawing Sheets

PACKAGING METHOD OF A PLURALITY OF CHIPS STACKED ON EACH OTHER AND PACKAGE STRUCTURE THEREOF

BACKGROUND OF THE INVENTION

1. Field of the Invention

The present invention relates to a packaging method of a plurality of chips stacked on each other and a package structure thereof, and more particularly to a packaging method and a package structure that provide a high heat-dissipating effect and a metal shield effect for the chips by using a substrate with a dielectric layer and a metal layer with the chips stacked between the dielectric layer and the metal layer, or between two surfaces of the metal layer.

2. Description of the Prior Art

Since consumers' requirements of electronic products increase day by day, improving technology for semiconductor manufacture and design of high frequency chips with better functions obviously becomes an important issue in today's research. For semiconductor packaging of the high frequency chips, serious electromagnetic wave problems occur frequently due to strong electromagnetic waves generated by the high frequency chips in operation, and the electromagnetic waves are transmitted outside through the package body to cause an electromagnetic interference (EMI) problem in nearby electronic devices, and possibly reduce electrical quality and heat-dissipating efficiency of the package. It is a serious problem of the high frequency semiconductor package.

A conventional packaging method uses a metal mask to cover the package and connects the metal mask to ground to solve the EMI problem. However, the metal mask has disadvantages of high weight and expense, and causes difficulty in mass production. The conventional method obviously does not fit in with a package of low weight, low cost, and mass production.

Therefore, developing a packaging method for preventing chips from being interfered by electromagnetic waves and a package structure thereof with package requirements of heat-dissipation, low cost, and low weight is a major issue in the related research field.

SUMMARY OF THE INVENTION

The present invention solves the technical problems by using a substrate with a dielectric layer and a metal layer with the chips stacked between the dielectric layer and the metal layer, or between two surfaces of the metal layer. The present invention not only achieves a high heat-dissipating effect and a metal shield effect for the chip, but also simplifies the anti-electromagnetic wave package process of the prior art and saves costs.

To solve the technical problems mentioned above, the present invention discloses a packaging method of a plurality of chips stacked on each other. The packaging method includes the following steps. A dielectric layer is provided. Next, a metal layer is formed on the dielectric layer where the metal layer includes a conducting trace area and a shielding area. Then, a solder mask is formed on the conducting trace area of the metal layer. Afterward, at least a first chip and at least a second chip are each packaged on the solder mask by a molding compound to form a package body of the first chip and a package body of the second chip. The first chip and the second chip are electrically connected to the conducting trace area. Finally, the dielectric layer and the metal layer is bended to connect a surface of the shielding area of the metal layer and a surface of the dielectric layer with the package body of the first chip and the package body of the second chip respectively.

To solve the technical problems mentioned above, the present invention discloses a package structure of a plurality of chips stacked on each other. The package structure includes a substrate, a first chip with a package body, and a second chip with a package body. The substrate has a dielectric layer, a metal layer, and a solder mask, where the metal layer includes a conducting trace area and a shielding area formed on the dielectric layer with the solder mask formed on the conducting trace area of the metal layer. The first chip is electrically connected to the conducting trace area, where the first chip is positioned on the solder mask and the package body of the first chip is connected to a surface of the metal layer to position the first chip between the solder mask and the shielding area of the metal layer. The second chip is electrically connected to the conducting trace area, where the second chip is positioned on the solder mask and the package body of the second chip is connected to another surface of the metal layer to position the second chip between the solder mask and the shielding area of the metal layer.

To solve the technical problems mentioned above, the present invention discloses a package structure of a plurality of chips stacked on each other. The package structure includes a substrate, a first chip with a package body, and a second chip with a package body. The substrate has a dielectric layer, a metal layer, and a solder mask, where the metal layer includes a conducting trace area formed on the dielectric layer and a shielding area extending from the conducting trace area with the solder mask formed on the conducting trace area of the metal layer. The first chip is electrically connected to the conducting trace area, where the first chip is positioned on the solder mask and the package body of the first chip is connected to a surface of the metal layer to position the first chip between the solder mask and the dielectric layer. The second chip is electrically connected to the conducting trace area, where the second chip is positioned on the solder mask and the package body of the second chip is connected to the shielding area surface of the metal layer to position the second chip between the solder mask and the shielding area of the metal layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
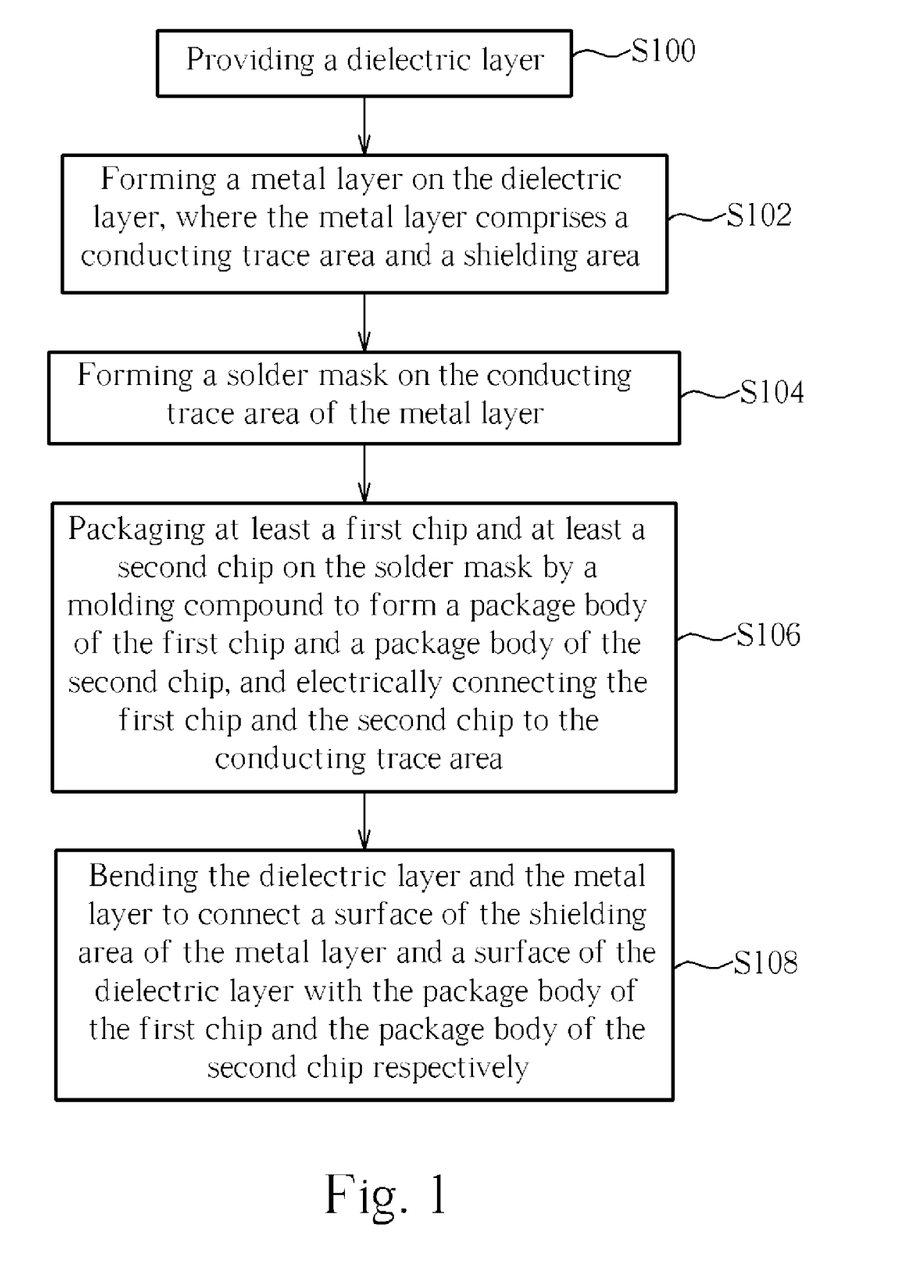
FIG. 1 is a flowchart of the first embodiment of a packaging method of a stack of base band chips and radio frequency (RF) chips according to the present invention.
Figure 2:
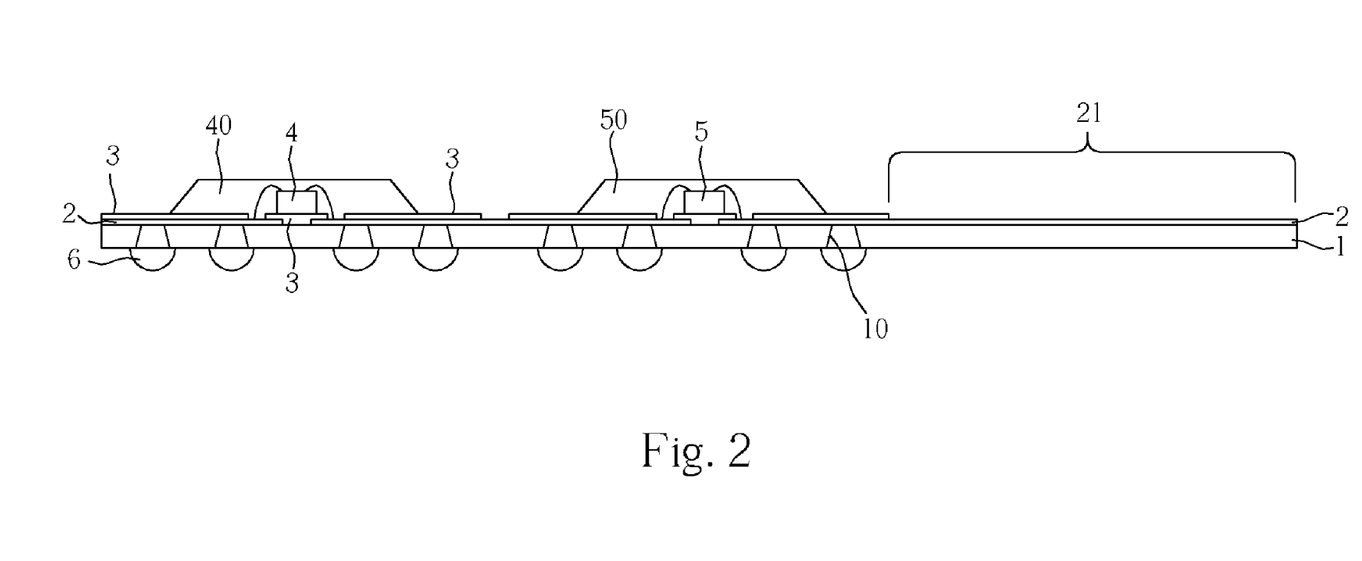
FIG. 2 is a cross-sectional diagram showing a package structure before bending the dielectric layer and the metal layer according to the first embodiment of the present invention.
Figure 3:
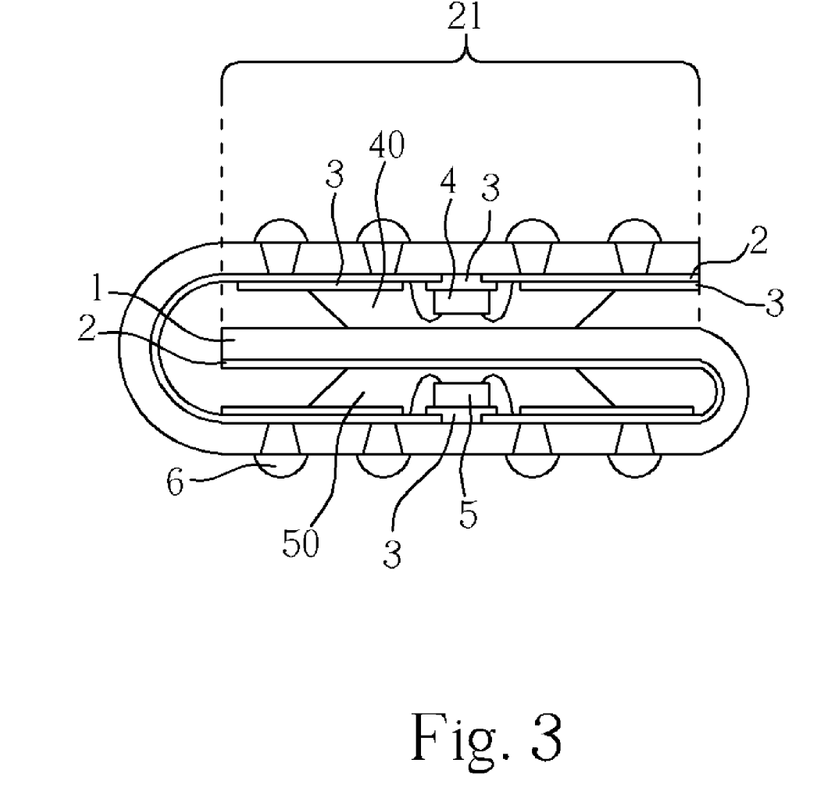
FIG. 3 is a cross-sectional diagram showing a package structure after bending the dielectric layer and the metal layer according to the first embodiment of the present invention.

Please refer to FIG. 1 to FIG. 3. FIG. 1 is a flowchart of the first embodiment of a packaging method of a stack of base band chips and radio frequency (RF) chips according to the present invention. FIG. 2 is a cross-sectional diagram showing a package structure before bending the dielectric layer and the metal layer according to the first embodiment of the present invention. FIG. 3 is a cross-sectional diagram showing a package structure after bending the dielectric layer and the metal layer according to the first embodiment of the present invention.

As shown in FIG. 1 to FIG. 3, the present invention provides a packaging method of a plurality of chips stacked on each other, and the packaging method includes the following steps. A dielectric layer 1 is provided (S100). Then, a metal layer 2 is formed on the dielectric layer 1, in which the metal layer 2 includes a conducting trace area 20 and a shielding area 21 (S102). Next, a solder mask 3 is formed on the conducting trace area 20 of the metal layer 2 (S104). Afterward, at least a first chip 4 and at least a second chip 5 are packaged on the solder mask 3 by a molding compound (not shown) to form a package body 40 of the first chip 4 and a package body 50 of the second chip 5, and the first chip 4 and the second chip 5 are electrically connected to the conducting trace area 20 (S106).

Next, the dielectric layer 1 and the metal layer 2 are bended to connect a surface of the shielding area 21 of the metal layer 2 and a surface of the dielectric layer 1 with the package body 40 of the first chip 4 and the package body 50 of the second chip 5 respectively (S108). The dielectric layer 1 and the shielding area 21 are connected to the package body 40 of the first chip 4 and the package body 50 of the second chip 5 respectively with an adhesive (not shown), in which the adhesive is a conductive adhesive, or other adhesives with electrical characteristics. The first chip 4 is a base band chip and the second chip 5 is an RF chip, or the first chip 4 is an RF chip and the second chip 5 is a base band chip. Additionally, the method of packaging the first chip 4 and the second chip 5 includes utilizing wire bonding, flip chip packaging, or quad flat non-leaded (QFN) packaging to electrically connect the first chip 4 and the second chip 5 to the conducting trace area 20.

Figure 4:
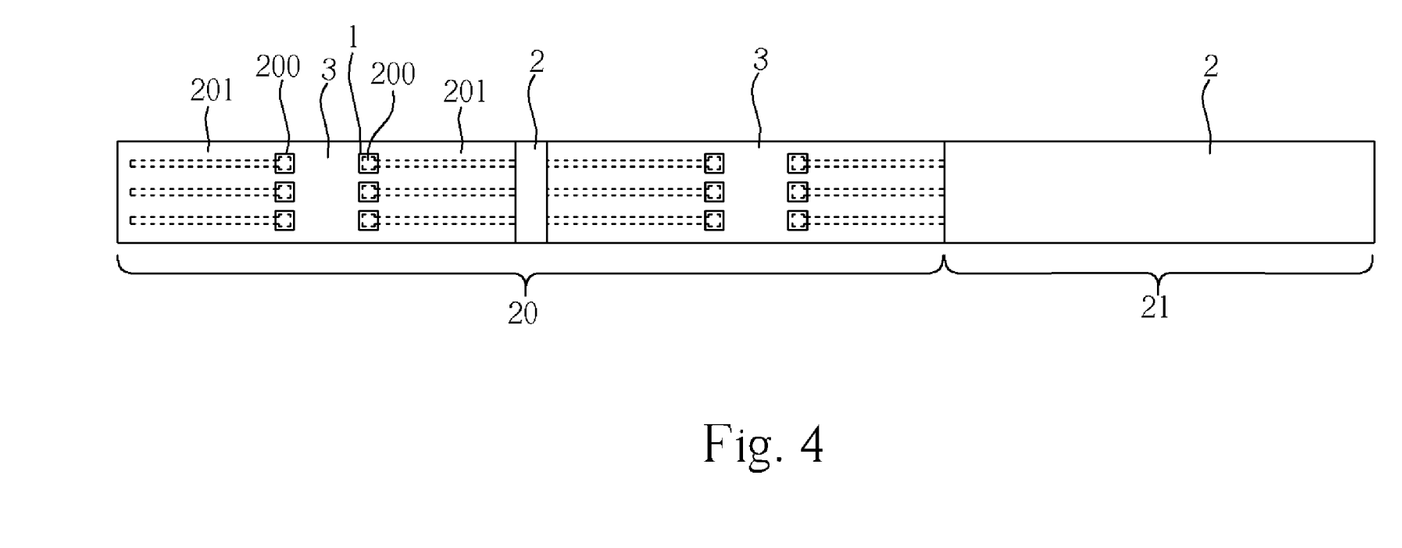
FIG. 4 is an upward diagram of the package structure according to the present invention when the metal layer is formed on the dielectric layer.

Please refer to FIG. 2 and FIG. 3 again with FIG. 4. The present invention discloses a package structure of a plurality of chips stacked on each other, and the package structure includes a substrate, a first chip 4 with a package body, and a second chip 5 with a package body.

The substrate has a dielectric layer 1, a metal layer 2, and a solder mask 3. The dielectric layer is a flexible polyimide substrate. A plurality of via holes 10 are formed in the dielectric layer 1 with corresponding solders 6 formed in the via holes 10. The metal layer 2 includes a conducting trace area 20 and a shielding area 21 formed on the dielectric layer 1, and the metal layer 2 further includes a plurality of pads 200 formed on the conducting trace area 20 and a plurality of conducting traces 201 electrically connected between the pads 200 and the solders 6. The solder mask 3 is formed on the conducting trace area 20 of the metal layer 2, and the conducting trace area 20 of the flexible polyimide substrate can be a single layer or a dual layer according to layout electrical requirements.

In addition, the first chip 4 is electrically connected to the solders 6 through the pads 200 and the conducting traces 201, and the first chip 4 is positioned on the solder mask 3 and electrically connected to the conducting trace area 20. The package body 40 of the first chip 4 is connected to a surface of the dielectric layer 1 to position the first chip 4 between the solder mask 3 and the dielectric layer 1.

The second chip 5 is electrically connected to the solders 6 through the pads 200 and the conducting traces 201, such that the second chip 5 is electrically connected to the conducting trace area 20 while the second chip 5 is positioned on the solder mask 3. The package body 50 of the second chip 5 is connected to surface of the shielding area 21 of the metal layer 2 to position the second chip 5 between the solder mask 3 and the shielding area 21 of the metal layer 2.

Figure 5:
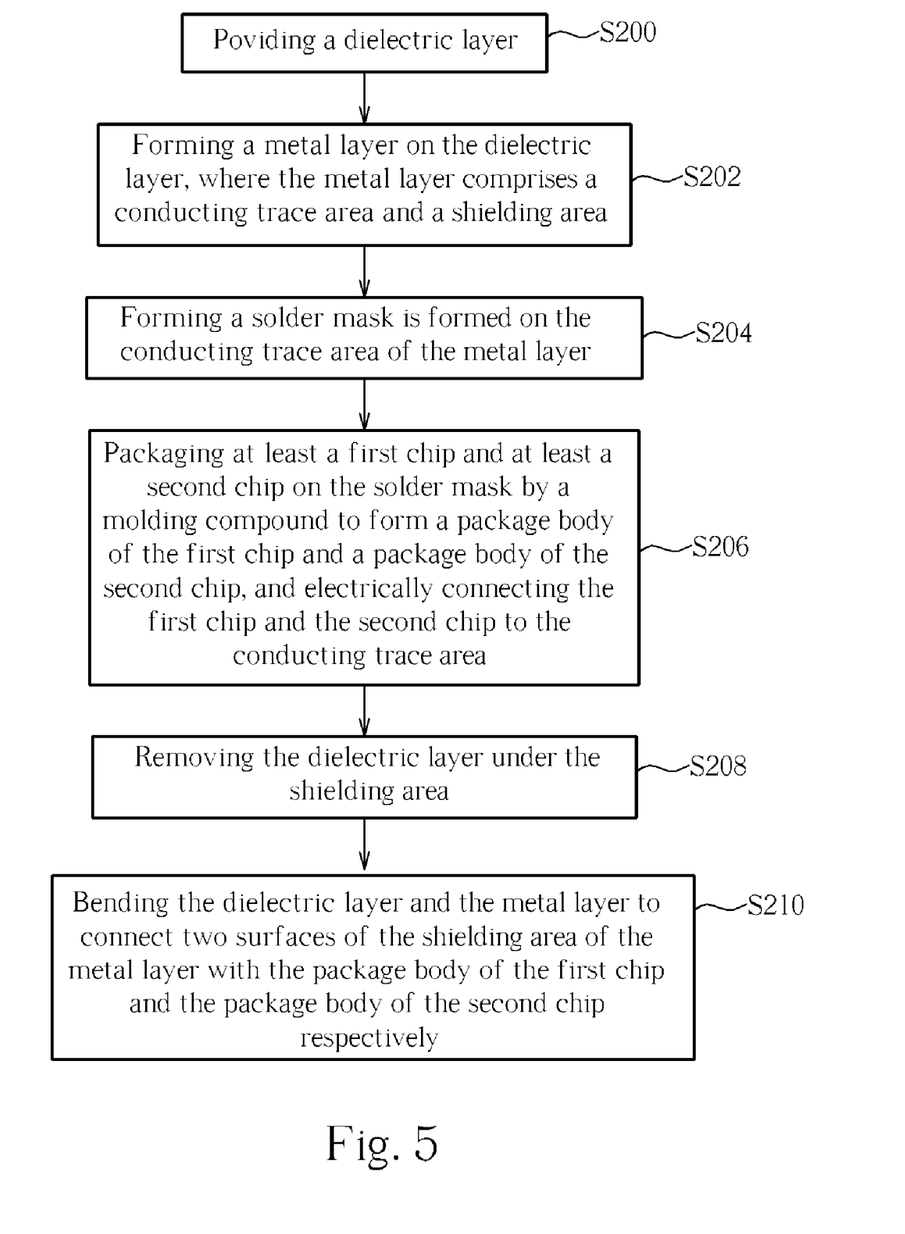
FIG. 5 is a flowchart of the second embodiment of a packaging method of a stack of base band chips and RF chips according to the present invention.
Figure 6:
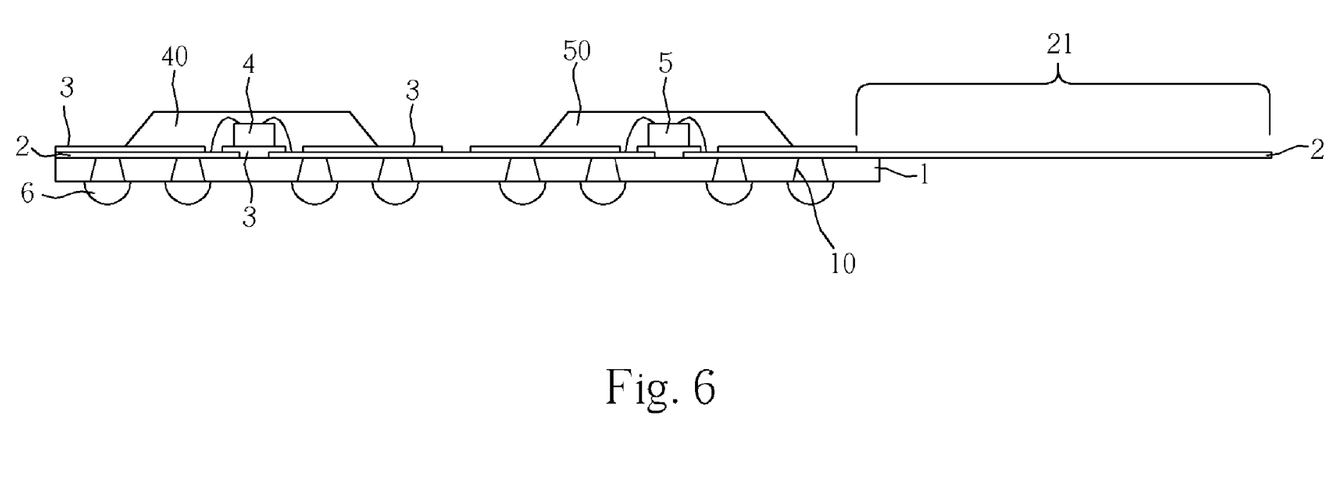
FIG. 6 is a cross-sectional diagram showing a package structure before bending the dielectric layer and the metal layer according to the second embodiment of the present invention.
Figure 7:
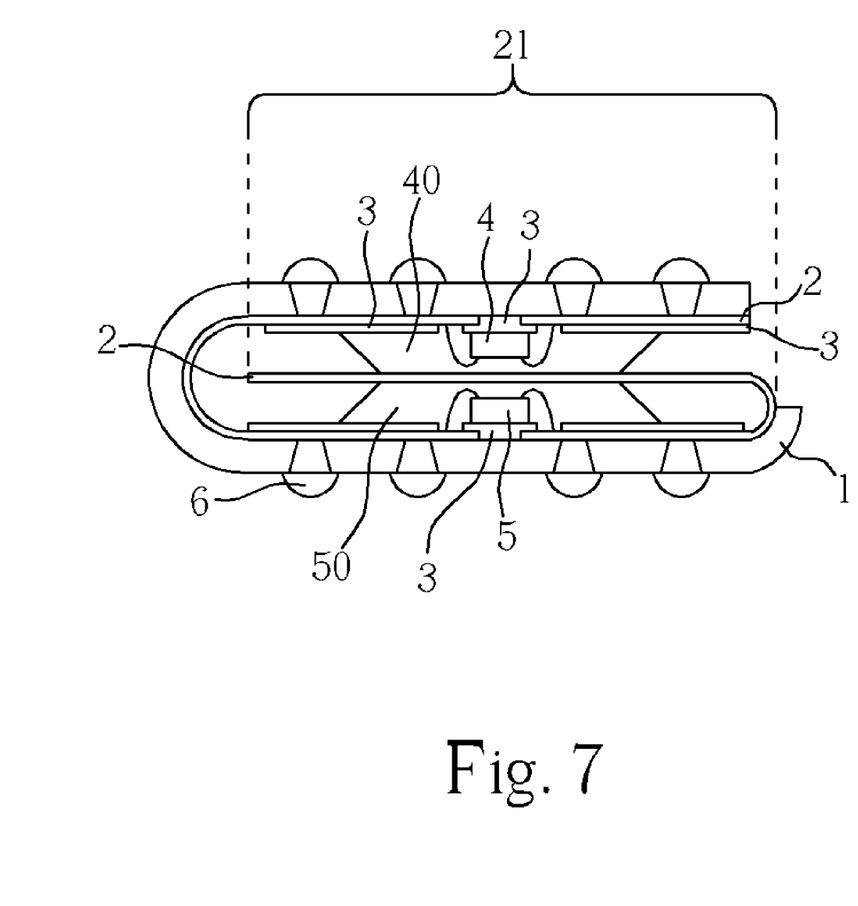
FIG. 7 is a cross-sectional diagram showing a package structure after bending the dielectric layer and the metal layer according to the second embodiment of the present invention.

Please refer to FIG. 5 to FIG. 7. FIG. 5 is a flowchart of the second embodiment of a packaging method of a stack of base band chips and RF chips according to the present invention. FIG. 6 is a cross-sectional diagram showing a package structure before bending the dielectric layer and the metal layer according to the second embodiment of the present invention. FIG. 7 is a cross-sectional diagram showing a package structure after bending the dielectric layer and the metal layer according to the second embodiment of the present invention.

As shown in FIG. 5 to FIG. 7, the present invention provides a packaging method of a plurality of chips stacked on each other and the packaging method includes the following steps. A dielectric layer 1 is provided (S200). Next, a metal layer 2 is formed on the dielectric layer 1, in which the metal layer 2 includes a conducting trace area 20 and a shielding area 21 (S202). Next, a solder mask 3 is formed on the conducting trace area 20 of the metal layer 2 (S204). Afterward, at least a first chip 4 and at least a second chip 5 are packaged on the solder mask 3 by a molding compound (not shown) to form a package body 40 of the first chip 4 and a package body 50 of the second chip 5. The first chip 4 and the second chip 5 are electrically connected to the conducting trace area 20 (S206). Next, the dielectric layer 1 under the shielding area 21 is removed (S208). Finally, the dielectric layer 1 and the metal layer 2 are bended to connect two surfaces of the shielding area 21 of the metal layer 2 with the package body 40 of the first chip 4 and the package body 50 of the second chip 5 respectively (S210).

Please refer to FIG. 6 and FIG. 7 again. The major difference between the second embodiment and the first embodiment of the present invention is that the shielding area 21 of the metal layer 2 extends outside from the conducting trace area 20 in the second embodiment, i.e. the dielectric layer 1 does not form the shielding area 21 on the metal layer 2. Therefore, the package body 40 of the first chip 4 is connected to a surface of the metal layer 2 to position the first chip 4 between the solder mask 3 and the shielding area 21 of the metal layer 2, and the package body 50 of the second chip 5 is connected to another surface of the metal layer 2 to position the second chip 5 between the solder mask 3 and the shielding area 21 of the metal layer 2. Thus, the shielding area 21 of the metal layer 2 is positioned between the package body 40 of the first chip 4 and the package body 50 of the second chip 5 to attain a high heat-dissipating effect and a metal shield effect for the first chip 4 and the second chip 5.

As mentioned above, the present invention stacks the first chip 4 and the second chip 5 between the dielectric layer 1 and the metal layer 2 (in the first embodiment), or between the two surfaces of the metal layer 2 (in the second embodiment), and thus the present invention not only achieves a high heat-dissipating effect and a metal shield effect for the chip, but also simplifies the anti-electromagnetic wave package process of the prior art and saves costs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A package structure with a plurality of chips stacked on each other comprising:
    a substrate comprising a dielectric layer, a metal layer, and a solder mask, wherein the metal layer comprises a conducting trace area and a shielding area formed on the dielectric layer, the solder mask formed on the conducting trace area of the metal layer;
    at least a first chip with a package body, electrically connected to the conducting trace area, wherein the first chip is positioned on the solder mask and the package body of the first chip is connected to a surface of the metal layer to position the first chip between the solder mask and the shielding area of the metal layer; and
    at least a second chip with a package body, electrically connected to the conducting trace area, wherein the second chip is positioned on the solder mask and the package body of the second chip is connected to another surface of the metal layer to position the second chip between the solder mask and the shielding area of the metal layer.

2. The package structure of the plurality of chips stacked on each other of claim 1, wherein the first chip is a base band chip and the second chip is a radio frequency chip, or the first chip is a radio frequency chip and the second chip is a base band chip.

3. The package structure of the plurality of chips stacked on each other of claim 1, wherein a plurality of via holes are formed on the dielectric layer and corresponding solders are formed in the via holes.

4. The package structure of the plurality of chips stacked on each other of claim 3, wherein the metal layer comprises a plurality of pads formed on the conducting trace area and a plurality of conducting traces electrically connected between the pads and the solders; whereby, the first chip and the second chip are electrically connected to the solders through the pads and the conducting traces.

5. The package structure of the plurality of chips stacked on each other of claim 1, wherein the dielectric layer is a flexible polyimide substrate.

6. The package structure of the plurality of chips stacked on each other of claim 5, wherein the conducting trace area of the flexible polyimide substrate is a single layer or a dual layer according to layout electrical requirements.

7. The package structure of the plurality of chips stacked on each other of claim 1, wherein the dielectric layer and the shielding area are connected to the package body of the first chip and the package body of the second chip respectively with an adhesive.

8. The package structure of the plurality of chips stacked on each other of claim 7, wherein the adhesive is a conductive adhesive.

9. The package structure of the plurality of chips stacked on each other of claim 1, wherein the method of packaging the first chip and the second chip comprises wire bonding, flip chip packaging, or quad flat non-leaded packaging.

* * * * *